US005462892A

United States Patent [19]

Gabriel

[11] Patent Number: 5,462,892
[45] Date of Patent: Oct. 31, 1995

[54] SEMICONDUCTOR PROCESSING METHOD FOR PREVENTING CORROSION OF METAL FILM CONNECTIONS

[75] Inventor: Calvin T. Gabriel, Cupertino, Calif.

[73] Assignee: VLSI Technology, Inc., San Jose, Calif.

[21] Appl. No.: 180,193

[22] Filed: Jan. 11, 1994

Related U.S. Application Data

[63] Continuation of Ser. No. 902,196, Jun. 22, 1992, abandoned.

[51] Int. Cl.[6] .......................... H01L 21/283; H01L 21/31
[52] U.S. Cl. .......................... 437/189; 437/192; 437/194; 437/197; 437/237; 148/DIG. 15
[58] Field of Search .......................... 156/643; 437/228, 437/197, 194, 187, 189, 190, 192, 237; 748/DIG. 15

[56] References Cited

U.S. PATENT DOCUMENTS

| 4,183,781 | 1/1980 | Eldridge et al. | 156/643 |
| 4,368,220 | 1/1983 | Eldridge et al. | 156/643 |
| 5,017,513 | 5/1991 | Takeuchi | 437/228 |
| 5,024,722 | 6/1991 | Cathey, Jr. | 156/643 |
| 5,134,093 | 7/1992 | Onishi et al. | 437/197 |

FOREIGN PATENT DOCUMENTS

408216A2  1/1991  European Pat. Off. .

OTHER PUBLICATIONS

Ma, J., et al., J. Vac. Sci. Technol. B8(5), Sep./Oct. 1990, pp. 1052–1057.
Wen–Yuang Lee, J. M. Eldridge and G. C. Schwartz, "Reactive Ion Etching Induced Corrosion of Al and Al–Cu films", J. Appl. Phys. 52(4), pp. 2994–2999 (Apr. 1981).
Y. Yoshida, Y. Itoh et al., "Quantifying Aluminum Post–Etch Treatments", 13th Tegal Seminar Proceedings, pp. 13–16 (1987).
G. Cameron and A. Chambers, "Successfully Addressing Post–Etch Corossion", Semiconductor International, pp. 142–147 (May 1989).

*Primary Examiner*—T. N. Quach
*Attorney, Agent, or Firm*—Flehr, Hohbach, Test, Albritton & Herbert

[57] ABSTRACT

A semiconductor wafer is processed so as to inhibit corrosion of aluminum or other metal interconnection lines thereon. The anti-corrosion processing of the wafer takes place after forming a metal layer on a semiconductor wafer, masking the metal layer with resist and reactive ion etching the conductive layer in an evacuated chamber so as to form metal interconnection lines. The semiconductor wafer is then moved under vacuum to a second evacuated chamber, where an oxide is formed on sidewalls of the metal layer by heating the semiconductor wafer while flowing dry oxygen-containing gas. The oxide on the sidewalls of the metal layer prevents corrosion of the metal layer by reactive halogen compounds remaining on the semiconductor wafer after the reactive ion etching step. The resist remaining on the wafer is removed after the semiconductor wafer is removed from the second evacuated chamber. Typically, the metal layer is formed from aluminum or aluminum-copper alloy, or from a successive layers of tungsten/titanium and aluminum-copper. The oxide formation step is preferably performed by heating the wafer to a temperature not exceeding 450° C. while flowing dry oxygen-containing gas, at a pressure or about one atmosphere or less, through the second evacuated chamber.

18 Claims, 1 Drawing Sheet

SEMICONDUCTOR PROCESSING METHOD FOR PREVENTING CORROSION OF METAL FILM CONNECTIONS

This is a continuation of application Ser. No. 07/902,196 filed Jun. 22, 1992 now abandoned.

The present invention relates generally to methods of processing semiconductor wafers during the manufacturing of semiconductor circuits, and particularly to methods and systems for preventing corrosion of aluminum and other metal films caused by halogen residues left on semiconductor wafers after plasma etching thereof.

BACKGROUND OF THE INVENTION

Electrical interconnections between transistors and other semiconductor circuit components are typically formed using "metal" interconnection lines. While doped polycrystalline silicon can be used for some circuit interconnections, virtually all semiconductor circuits use at least one layer of metal interconnection lines. Such metal interconnection lines are typically formed by depositing a thin film of aluminum or aluminum-copper alloy on the wafer, masking the aluminum layer with resist to define a set of metal interconnection lines, and then anisotropically etching the portions of the metal layer not covered by resist. Reactive ion etching (plasma etching) of metal thin films is usually performed using a plasma in which the wafer is bombarded with ions that react with and remove the exposed regions of metal. Plasma etching is performed in a vacuum chamber, and the etcher's vacuum pumping system removes most, but not all, of the reaction products. Advantages of plasma ion etching over conventional wet etching processes include the possibilities of process automation, less undercutting of wall profiles, and higher packing density.

Halogens, such as chlorine ions, are almost always used when plasma etching aluminum and aluminum alloy films on semiconductor wafers. It is well known among semiconductor manufacturers that the reactive ion etching process creates halogen compounds, which will hereinafter assumed, for the purposes explanation, to be chlorine compounds. It is also well known that some of the chlorine compounds produced by the plasma etching process remain on the wafer as a residue after completion of the etching process, and thereafter hydrolyze by reaction with ambient moisture to produce hydrochloric acid (HCl). The hydrochloric acid resulting from this reaction is able to dissolve aluminum from the sidewalls of the etched conductors where the passive native oxide has not regrown sufficiently after the etching process. The problem is compounded by the effect that this reaction scheme is self-perpetuating in the presence of moisture; as long as moisture is available, corrosion of the aluminum will continue. The extent and rate of the metal corrosion reactions depend on many factors, including the amount of chlorine-containing compounds remaining on the wafer after the metal etching step. However, it is believed that even a small amount of chlorine can cause significant corrosion damage and semiconductor device failures.

The corrosion resulting from exposure of aluminum interconnects to air frequently leads to rapid and catastrophic corrosion of the etched conductors. Such corrosion induces failure of integrated circuits and reduces the yield of fabrication processes. As a result, almost all aluminum etch processes include post dry-etch corrosion prevention cycles. These cycles are intended to delay the onset of the corrosion mechanism until a later time in the manufacturing process when a thorough passivation process can be achieved.

Most techniques for preventing corrosion attempt to remove chlorine from the wafer. For example, heating the wafer causes some of the volatile chlorine-containing compounds to evaporate from the wafer surface. One technique for heating the wafer is to irradiate it with an infrared lamp while under vacuum. Another method used to remove chlorine from the wafer surface is to rinse the wafer in deionized water or other solutions before or while stripping the resist mask layer on top of the metal connection lines.

The corrosion of structures formed by reactive ion etching has also been attempted to be suppressed through formation of a protective layer on the etched surface. For example, thin polymers have been deposited on the etched wafer surface to inhibit attack of the patterned metal. This is typically accomplished by immersing the wafers in a hydrogen-containing fluorocarbon plasma, using $CHF_3$. Similarly, it has been found that oxidizing the aluminum surface by heating the wafer in an oxygen ambient in a furnace helps prevent corrosion by forming an oxide barrier that substantially prevents the corrosion reaction. The layer of resist on top of the metal is generally removed before the oxidation step, because the temperature used during oxidation can make it difficult to later remove the resist. As a result, the wafer is exposed to the atmosphere prior to oxidation, and therefore corrosion may still occur between completion of the etching step and oxidation of the aluminum.

A factor making the above described corrosion problem even more critical is the growing use of metal interconnects in which the aluminum or aluminum-copper layer is "sandwiched" between upper and lower thin tungsten/titanium (W/Ti) layers. A description of such metal interconnect layers and a process for making them can be found in U.S. Pat. No. 4,019,234. The W/Ti layer below the aluminum layer prevents diffusion of aluminum into the silicon substrate, and the W/Ti layer above the aluminum layer forms a compressive cap that prevents hillocking of the aluminum and also reduces reflectivity of the metal layer, thereby facilitating photolithographic masking of the metal interconnection layer.

It has been the inventor's experience that the extent and rate of metal corrosion is significantly worse for metal layers comprising a W/Ti-Aluminum-W/Ti metal sandwich than for ordinary aluminum metal layers. In particular, the amount of corrosion which occurs between metal etching and resist stripping appears to be more significant for such metal sandwiches, causing more device failures. While the mechanism that makes the corrosion problem worse for such wafers is not known, it can be speculated that the interface between the W/Ti layers and its neighbors creates a electrical potential or field that accelerates the rate of the corrosion process.

It is therefore a primary object of the present invention to provide a processing method which significantly and reliably reduces metal interconnect corrosion.

SUMMARY OF THE INVENTION

In summary, the present invention is a method and apparatus for etching and preventing subsequent corrosion of a metal layer on a semiconductor wafer. The metal layer is initially masked with a resist material and then etched within a first evacuated chamber of a reactive ion etching system. Subsequent to being etched within the first chamber the wafer is moved under vacuum to a second evacuated chamber. An oxide layer is formed on the sidewalls of the etched metal layer by heating the wafer within the second evacuated chamber in the presence of an oxygen or oxygen-containing gas flow. The oxide layer protects the aluminum layer from acidic corrosion engendered by reactive halogen compounds remaining on the semiconductor wafer after etching.

The resist remaining on the wafer is removed after the semiconductor wafer is removed from the second evacuated chamber. Typically, the metal layer is formed from aluminum or aluminum-copper alloy, and the oxide formation step is performed by heating the wafer to a temperature not exceeding 450° C. while flowing dry oxygen or oxygen-containing gas, at a pressure of about one atmosphere or less, through the second evacuated chamber. The metal layer may also have tungsten/titanium layers above and/or below the aluminum layer.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
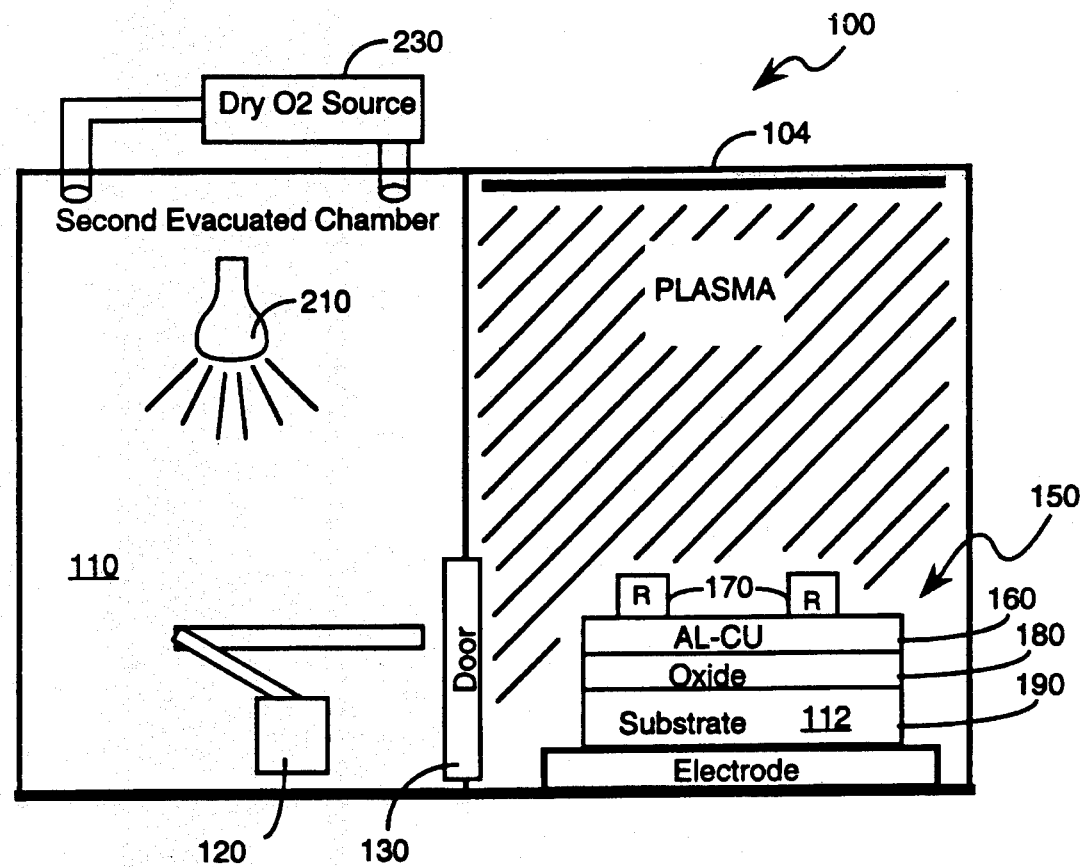
FIG. 1 is a schematic diagram of a plasma etching system having an etching chamber and a second chamber.

Referring to FIG. 1, there is shown a schematic diagram of an etching system 100 used to implement the wafer processing method of the present invention. The etching system 100 includes an evacuated plasma etching chamber 104 and an evacuated post-etch processing chamber 110. Semiconductor wafers may be transferred from the etching chamber 104 to the post-etch processing chamber 110 by a wafer movement arm 120 or other wafer movement mechanism. Wafers transported by the wafer movement arm 120 are spared exposure to the ambient atmosphere by the provision of a door 130 which, when opened, causes a passageway to be created between the evacuated interiors of the chambers 104 and 110. The etching system 100 thus allows corrosion-prevention processing to be performed within chamber 110 subsequent to reactive ion etching within chamber 104 without intervening exposure to moisture within the ambient environment. As was discussed in the Background of the Invention, halogen compound residues such as chlorine which remain on etched semiconductor surfaces after plasma etching tend to react with moisture in the ambient environment to form acids (e.g., HCl) capable of significantly damaging the etched wafer. The etching system 100 is designed to suppress such acid formation by enabling post-etch processing to be carried out prior to exposure of the etched wafer to the ambient atmosphere.

The specific post-etch processing effected within the chamber 110 includes, but is not limited to, heating the etched semiconductor wafers in the presence of an oxygen flow or oxygen-containing gas. As is described more fully below, this process results in the formation of a protective oxide layer upon the sidewall surfaces of interconnection lines created during plasma etching. The protective oxide layer allows wafers processed by the inventive etching system 100 and thereafter exposed to the ambient atmosphere to better withstand the corrosive effects of acids formed from reactive halogen compound residues.

Again referring to FIG. 1, the chamber 104 includes a semiconductor wafer 150 (not drawn to scale) shown prior to undergoing a reactive ion etch conducted for the purpose of forming a pattern of Al—Cu interconnection lines. The interconnection pattern is formed from an Al—Cu layer 160, and is defined by a conventional deposition of resist material 170. The resist 170 prevents the portions of the Al—Cu layer 160 and a silicon oxide layer 180 lying thereunder from being etched by the plasma confined within the chamber 104. The silicon oxide layer 180 and Al—Cu layer 160 are supported by a silicon substrate 190.

The etching chamber 104 may be implemented using, for example, the Rainbow 4600 metal etch system manufactured by Lam Research of Fremont, Calif. The wafer 150 is initially inserted into the chamber 104 through a load-lock port (not shown). Wafers are processed within the chamber 104 following a preliminary initialization procedure which includes gas flow stabilization and plasma ignition. In a first etch step native oxide covering the semiconductor wafer 150 is removed to ensure surface uniformity. A bulk metal etch step follows in which the (unmasked) regions of the Al—Cu layer 160 and the oxide layer 180 not covered by resist 170 are removed. Etchers such as the aforementioned Rainbow 4600 system generally include endpoint detection systems which allow etching to be automatically terminated upon removal of the unmasked areas above the substrate 190.

Upon completion of the metal etch process within chamber 104, the door 130 is opened and wafer 150 is transported under vacuum by the wafer movement arm 120 to the post-etch processing chamber 110. It is noted that the wafer 150 is transferred to the chamber 110 without being exposed to the atmosphere. In this way residual etching products (e.g., chlorine or other halogen compounds) remaining on the wafer 150 are prevented from reacting with atmospheric moisture to produce corrosion-inducing acids such as HCl. The wafer is heated within the chamber 110 by an infrared lamp 210 or other heating apparatus (such as a hot plate in contact with the bottom surface of the wafer). Heating the wafer 150 causes volatile compounds containing chlorine to evaporate from the etched surface of the wafer 150. Contemporaneously, a dry oxygen or oxygen-containing gas source 230 forces an oxygen stream over the surface of the wafer 150 in order to induce formation of a thin native oxide thereon, The native oxide serves to protect the wafer surface from acidic corrosion upon subsequent exposure to the atmosphere.

The temperature within chamber 110, as well as the pressure and flow rate of the oxygen source 230, are chosen such that the native oxide formed on the wafer 150 is sufficiently thick to substantially prevent acidic corrosion of the etched interconnections. For example, an oxide layer of 40 to 100 Angstroms may be formed by flowing dry oxygen at a pressure of less than one atmosphere at a temperature of 200 degrees centigrade (°C.) for a few minutes. Although higher-temperature heating may result in increased chlorine evaporation, the temperature within the chamber 110 should be maintained below approximately 250° C. in order to avoid damaging the resist 170 remaining on the wafer 150. Other corrosion-prevention techniques, such as rinsing the wafer 150 with deionized water, may also be performed within the post-etching chamber 110.

In the preferred embodiment, the dry oxygen or oxygen-containing gas from source 230 is flowed through chamber 110 at pressures of about one atmosphere or less. However, in an alternate embodiment, the dry oxygen or oxygen-containing gas from source 230 is flowed through chamber 110 at pressures above one atmosphere, in which case special equipment needs to be used (e.g., an additional load lock mechanism) to separate the two chambers 104 and 110 because one is operated at pressures well below one atmosphere (typically around 0.01 atmospheres) while the other is operated at pressures above one atmosphere.

Figure 2:
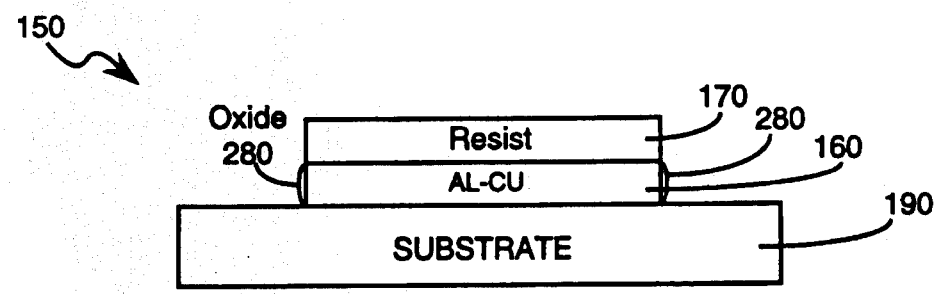
FIG. 2 is a cross-sectional view of an etched aluminum metal line after formation of a sidewall oxide thereon in accordance with the present invention.

FIG. 2 shows a cross-sectional representation of an etched metal line formed by processing the wafer 150 within the chambers 104 and 110. As is indicated by FIG. 2, a protective oxide layer 280 is formed on sidewall portions of the Al—Cu layer 160 as a consequence of the dry oxygen flow from the oxygen source 230. The oxide layer 280 prevents undercutting of the Al—Cu layer 160 by any chlorine-containing acids which may form upon removal of the etched wafer 150 from the chamber 110 through a load-lock port (not shown).

As was mentioned in the Background of the Invention, the inventor has observed that the extent and rate of acid-induced corrosion is more pronounced for metal layers consisting of W/Ti-Aluminum-W/Ti metal sandwiches than for ordinary aluminum metal layers. Again, such metal sandwiches appear to undergo a heightened degree of corrosion relative to exclusively aluminum layers between metal etching and resist stripping, thereby leading to more device failures.

Figure 3:
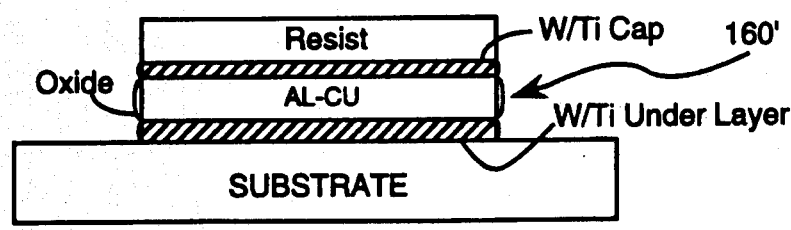
FIG. 3 is a cross-sectional view of an etched aluminum metal line, having tungsten-titanium layers above and below it, after formation of a sidewall oxide thereon in accordance with the present invention.

Accordingly, FIG. 3 shows a cross-sectional view of an etched aluminum metal line 160', having tungsten-titanium (W/Ti) layers above and below it, after formation of a sidewall oxide thereon in accordance with the present invention. In particular, treatment within the chamber 110 results in the creation of a protective oxide upon the etched lateral surfaces of both an Al—Cu layer and the adjacent W/Ti layers. Wafers incorporating W/Ti metal sandwiches may be processed within the chamber 110 under conditions substantially similar to those described above with reference to processing of standard Al—Cu interconnection lines.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. In addition, in the context of the appended claims an "aluminum" layer or interconnection line is intended to identify layers or interconnection lines formed using (A) aluminum, (B) an aluminum-copper alloy (typically about one percent copper), (C) a sandwich of tungsten-titanium and aluminum or aluminum-copper layers, (D) an aluminum-silicon alloy (typically about one percent silicon), or (E) an aluminum-silicon-copper alloy.

What is claimed is:

1. A method of processing a semiconductor wafer, the method comprising the steps of:

forming a conductive layer on a semiconductor wafer, said layer being formed from a metal capable of being oxidized;

masking said conductive layer with resist;

reactive ion etching said conductive layer in a first chamber, said reactive ion etching exposing a sidewall of said conductive layer adjacent to said resist;

thereafter, moving said semiconductor wafer under vacuum to a second chamber, wherein said moving step is performed without intervening exposure to atmospheric moisture; and forming an oxide on said exposed sidewall of said conductive layer by heating said semiconductor wafer in the presence of oxygen, said step of forming an oxide taking place in said second chamber while said resist continues to mask said conductive layer.

2. The method of claim 1, further including:

removing said semiconductor wafer from said second chamber and then stripping said resist on said conductive layer.

3. The method of claim 1, wherein the heating temperature used during said step of forming an oxide is between about 200° C. and about 250° C.

4. The method of claim 1 wherein said conductive layer is formed from aluminum, and wherein said step of forming an oxide is performed by heating said wafer to a temperature from about 200° C. to about 450° C. in the presence of dry oxygen-containing gas, at a pressure of approximately one atmosphere or less.

5. The method of claim 4, wherein the step of forming said conductive layer includes depositing a layer of aluminum-copper alloy on said semiconductor wafer.

6. The method of claim 4, wherein the step of forming said conductive layer includes, in sequence, the steps of depositing a tungsten/titanium layer on said semiconductor wafer, and forming an aluminum-copper alloy layer over said tungsten/titanium layer on said semiconductor wafer.

7. A method of processing a semiconductor wafer, the method comprising the steps of:

forming a conductive layer on a semiconductor wafer, said layer being formed from a metal capable of being oxidized;

forming a masking layer on said conductive layer to define a desired conductive layer interconnect pattern;

reactive ion etching said conductive layer forming said interconnect pattern having exposed sidewalls and a top surface covered by said masking layer; and without intervening exposure to atmospheric moisture forming an oxide on said exposed sidewall of said conductive layer by heating said semiconductor wafer in the presence of oxygen, said masking layer preventing formation of oxide on the top surface.

8. The method of claim 7, further including:

after said forming an oxide step, stripping said masking layer on said conductive layer.

9. The method of claim 7, wherein the heating temperature used during said step of forming an oxide is between about 200° C. and about 250° C.

10. The method of claim 7, wherein said conductive layer is formed from aluminum, and wherein said step of forming an oxide is performed by heating said wafer to a temperature from about 200° C. to about 450° C. in the presence of dry oxygen-containing gas, at a pressure of approximately one atmosphere or less.

11. The method of claim 10, wherein the step of forming said conductive layer includes depositing a layer of aluminum-copper alloy on said semiconductor wafer.

12. The method of claim 10, wherein the step of forming said conductive layer includes, in sequence, the steps of depositing a tungsten/titanium layer on said semiconductor wafer, and forming an aluminum-copper alloy layer over said tungsten/titanium layer on said semiconductor wafer.

13. A semiconductor wafer processing method having a two dry step process, the method comprising the steps of:

forming a conductive layer on a semiconductor wafer, said conductive layer being formed from a metal capable of being oxidized;

forming a masking layer on said conductive layer to define a desired conductive layer interconnect pattern;

performing a first dry step in a first chamber, said first dry step comprising the step of reactive ion etching said conductive layer and thereby exposing a sidewall of said conductive layer;

moving said wafer from said first chamber to a second chamber under vacuum, wherein said moving step is performed without intervening exposure to atmospheric moisture; and performing a second dry step in said second chamber, said second dry step comprising the step of forming a metal oxide on said exposed sidewall of said conductive layer by heating said wafer in the presence of oxygen, said masking layer preventing the formation of metal oxide on the top of said conductive layer.

14. The method of claim 13, further including:

removing said semiconductor wafer from said second chamber and then stripping said masking layer on said conductive layer.

15. The method of claim 13, wherein the heating temperature used during said forming an oxide step is between about 200° C. and about 250° C.

16. The method of claim 13, wherein said conductive layer is formed from aluminum, and wherein said step of oxide formation is performed by heating said wafer to a temperature from about 200° C. to about 450° C. in the presence of dry oxygen-containing gas, at a pressure of approximately one atmosphere or less.

17. The method of claim 16, wherein the step of forming said conductive layer includes depositing a layer of aluminum-copper alloy on said semiconductor wafer.

18. The method of claim 16, wherein the step of forming said conductive layer includes, in sequence, the steps of depositing a tungsten/titanium layer on said semiconductor wafer, and forming an aluminum-copper alloy layer over said tungsten/titanium layer on said semiconductor wafer.

* * * * *